(12) United States Patent
Saito

(10) Patent No.: US 11,789,061 B2
(45) Date of Patent: Oct. 17, 2023

(54) INTEGRATED CIRCUIT AND SEMICONDUCTOR DEVICE

(71) Applicant: FUJI ELECTRIC CO., LTD., Kawasaki (JP)

(72) Inventor: Isao Saito, Nagano (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 112 days.

(21) Appl. No.: 17/411,914

(22) Filed: Aug. 25, 2021

(65) Prior Publication Data

US 2022/0082606 A1 Mar. 17, 2022

(30) Foreign Application Priority Data

Sep. 11, 2020 (JP) .................................. 2020-153052

(51) Int. Cl.
*G01R 31/26* (2020.01)
*G01R 31/28* (2006.01)

(52) U.S. Cl.
CPC ..... *G01R 31/2621* (2013.01); *G01R 31/2851* (2013.01)

(58) Field of Classification Search
CPC .... G01R 31/00; G01R 31/26; G01R 31/2621; G01R 31/2608; G01R 31/28; G01R 31/2851; G01R 31/2884; G01R 31/32; G01R 31/3277; H02H 1/00; H02H 1/0007; H02H 1/08; H02H 7/0833
See application file for complete search history.

(56) References Cited

U.S. PATENT DOCUMENTS

| 2012/0161681 A1* | 6/2012 | Kuroda | H03K 17/18 318/400.21 |
| 2015/0014687 A1* | 1/2015 | Nakajima | H05B 47/25 257/48 |
| 2020/0028503 A1* | 1/2020 | Soma | H03K 17/063 |

FOREIGN PATENT DOCUMENTS

| JP | 2015008612 A | * | 1/2015 | ............. H02M 1/32 |
| JP | 2015-171305 A | | 9/2015 | |
| JP | 2019-054384 A | | 4/2019 | |

* cited by examiner

*Primary Examiner* — Son T Le
(74) *Attorney, Agent, or Firm* — Rabin & Berdo, P.C.

(57) ABSTRACT

An integrated circuit for a semiconductor device that includes a first terminal for receiving a power supply voltage, a second terminal to which a load is to be coupled, and first and second metal-oxide-semiconductor (MOS) transistors each having a drain electrode and a source electrode, the source electrodes being respectively coupled to the first and second terminals. The integrated circuit includes a first line coupled to the drain electrode of the first MOS transistor and the drain electrode of the second MOS transistor, a second line to which a first voltage lower than the power supply voltage is applied, a first device configured to couple the first line and the second line, to prevent the first line from being brought into a floating state, and a detection circuit configured to detect a first abnormality in at least the first MOS transistor based on a voltage level of the first line.

14 Claims, 8 Drawing Sheets

|   |   | OFF (Sb = L) | | | ON (Sb = H) | | |
| --- | --- | --- | --- | --- | --- | --- | --- |
|   |   | LINE Le (FD) | LINE Lf (OUT) | So(ST) | LINE Le (FD) | LINE Lf (OUT) | So(ST) |
| 1 | NORMAL | H−0.7V | L | H | H | H | L |
| 2 | M1 NOT TURNED ON | H−0.7V | L | H | H−0.7V | H−0.7V | H |
| 3 | POWER SOURCE OPEN-CIRCUITED | H−5.5V (V1) | L | L | L | L | H |
| 4 | M1 SHORT-CIRCUITED | H | L | L | H | H | L |
| 5 | M2 NOT TURNED ON | H−0.7V | L | H | H | L | H |
| 6 | OUTPUT OPEN-CIRCUITED | H−0.7V | H−5.5V (V2) | L | H | H | L |
| 7 | M2 SHORT-CIRCUITED | H−0.7V | H−0.7V | L | H | H | L |

FIG.6

INTEGRATED CIRCUIT AND SEMICONDUCTOR DEVICE

CROSS-REFERENCE TO RELATED APPLICATION

The present application claims priority pursuant to 35 U.S.C. § 119 from Japanese patent application number 2020-153052 filed on Sep. 11, 2020, the entire disclosure of which is hereby incorporated by reference herein.

BACKGROUND

Technical Field

The present disclosure relates to an integrated circuit and a semiconductor device.

Description of the Related Art

An electronic control unit (ECU) provided between a battery and a load such as a motor in an automobile typically includes a switch to supply power from the battery to the load. Examples of such a switch to supply power to the load may include two MOS transistors coupled in series (for example, Japanese Patent Application Publication No. 2019-54384).

Incidentally, repeated switching of such two metal-oxide-semiconductor (MOS) transistors may cause failure of the two MOS transistors. In Japanese Patent Application Publication No. 2019-54384, the failure of the two MOS transistors is detected by changing a voltage to be applied to a predetermined node at which the two MOS transistors are coupled. However, such a technique needs to detect a change in the voltage at the predetermined node and thus needs a complicated detection circuit.

The present disclosure is directed to provision of an integrated circuit capable of detecting a switch failure without a complicated configuration.

SUMMARY

An aspect of the present disclosure is an integrated circuit for a semiconductor device that includes a first terminal for receiving a power supply voltage, a second terminal to which a load is to be coupled, and a first metal-oxide-semiconductor (MOS) transistor and a second MOS transistor, each having a drain electrode and a source electrode, the source electrodes of the first and second MOS transistors being respectively coupled to the first and second terminals, the integrated circuit comprising: a first line coupled to the drain electrode of the first MOS transistor and the drain electrode of the second MOS transistor; a second line to which a first voltage lower than the power supply voltage is applied; a first device configured to couple the first line and the second line, to prevent the first line from being brought into a floating state; and a detection circuit configured to detect a first abnormality in at least the first MOS transistor based on a voltage level of the first line.

Another aspect of the present disclosure is a semiconductor device, comprising: a first terminal for receiving a power supply voltage; a second terminal to which a load is to be coupled; first and second metal-oxide-semiconductor (MOS) transistors each having a drain electrode, the drain electrodes being coupled to each other between the first terminal and the second terminal; a first line coupled to the drain electrodes of the first and second MOS transistors; a second line to which a first voltage lower than the power supply voltage is applied; a first device configured to couple the first line and the second line, to prevent the first line from being brought into a floating state; and a detection circuit configured to detect whether there is an abnormality in at least the first MOS transistor based on a voltage level of the first line, when the first and second MOS transistors are off.

BRIEF DESCRIPTION OF THE DRAWINGS

FIG. 6 is a diagram illustrating an operation of a detection circuit 78.

DETAILED DESCRIPTION

At least following matters will become apparent from the descriptions of the present specification and the accompanying drawings.

Embodiment

Figure 1:
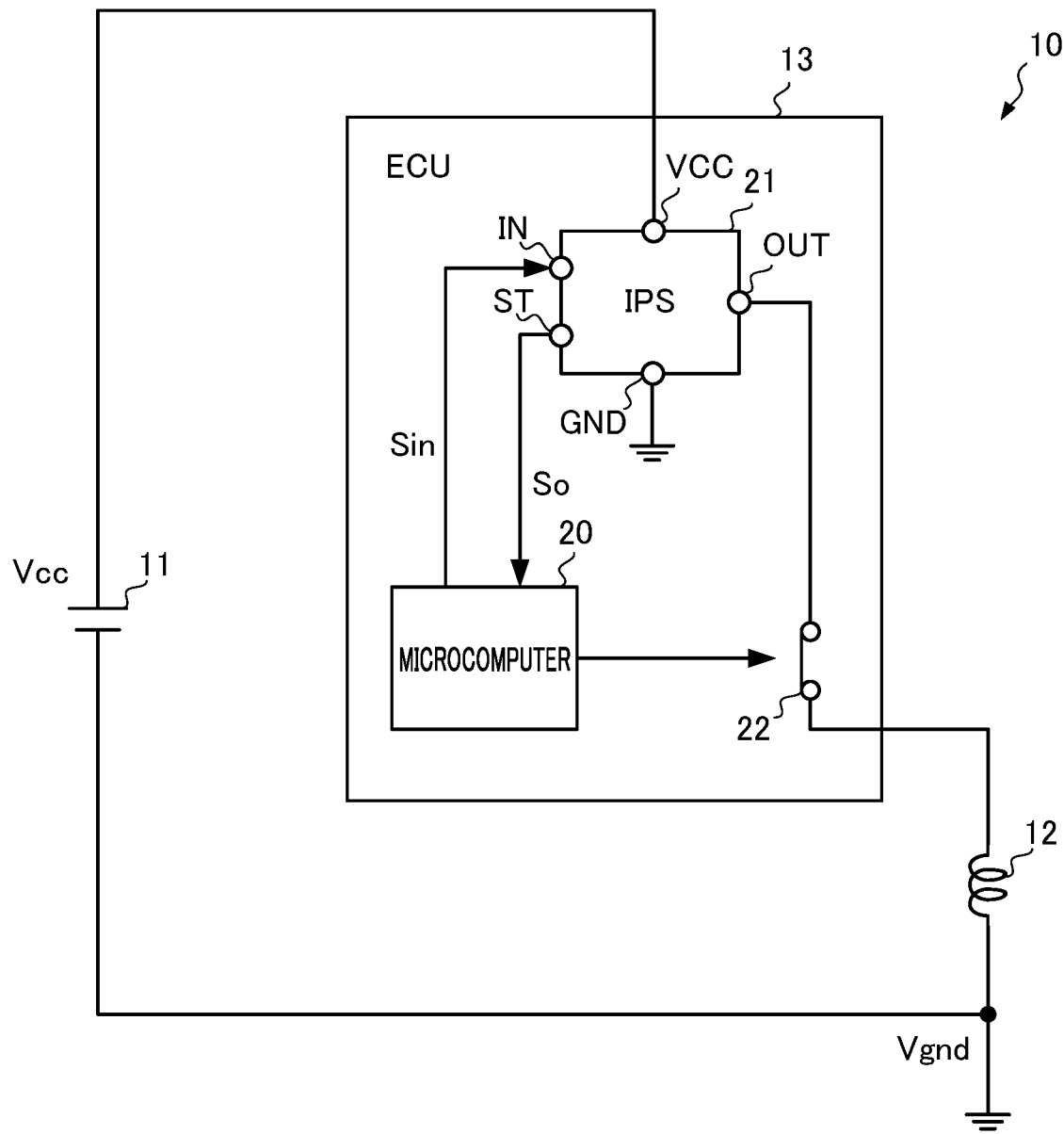
FIG. 1 is a diagram illustrating an example of a motor control device 10.

FIG. 1 is a diagram illustrating a configuration of a motor control device 10 according to an embodiment of the present disclosure. The motor control device 10 is a device for controlling a motor coil 12 provided in an automobile using power from a battery 11, and comprises an electronic control unit (ECU) 13. The battery 11 is, for example, a lithium-ion battery for automobiles, and outputs a power supply voltage Vcc of 12 V.

The ECU 13 is a device for controlling the coil 12, and comprises a microcomputer 20, an intelligent power switch (IPS) 21, and a switch 22.

The microcomputer 20 controls the IPS 21 and the switch 22 in response to an instruction (not illustrated) inputted from the outside. The microcomputer 20, for example, stops the operation of the IPS 21 and turns off the switch 22, upon receiving, from the IPS 21, a signal indicating that there is an abnormality in a circuit and/or the like inside the IPS 21.

The IPS 21 is a "semiconductor device" that switches between supplying and not supplying the power supply voltage Vcc of the battery 11 to the coil 12 in response to a signal Sin outputted from the microcomputer 20. The IPS 21 outputs a signal So indicating whether there is an abnormality in a circuit and/or the like therein. The IPS 21 includes terminals VCC, GND, IN, ST, and OUT. The power supply voltage Vcc of the battery 11 is applied to the terminal VCC, and the terminal GND is grounded. The signal Sin from the microcomputer 20 is inputted to the terminal IN, and the signal So indicating whether there is an abnormality in a circuit and/or the like in the IPS 21 is outputted from the terminal ST. The terminal OUT is a terminal to which the coil 12, which is a load, is coupled through the switch 22. When a switch (described later) in the IPS 21 is on, the voltage Vcc is outputted from the terminal OUT. In an embodiment of the present disclosure, it is assumed that the voltage at the terminal GND is a ground voltage Vgnd (0V).

As will be described later in detail, the IPS 21 appropriately protects the coil 12 and the ECU 13 when the battery 11 is reversely coupled. For convenience, the following description is given assuming that the microcomputer 20 keeps the switch 22 on in an embodiment of the present disclosure. Also, in an embodiment of the present disclosure, the term "coupling" refers to electrically coupling two nodes through wiring or an electric element.

<<<Configuration of IPS 21>>>

Figure 2:
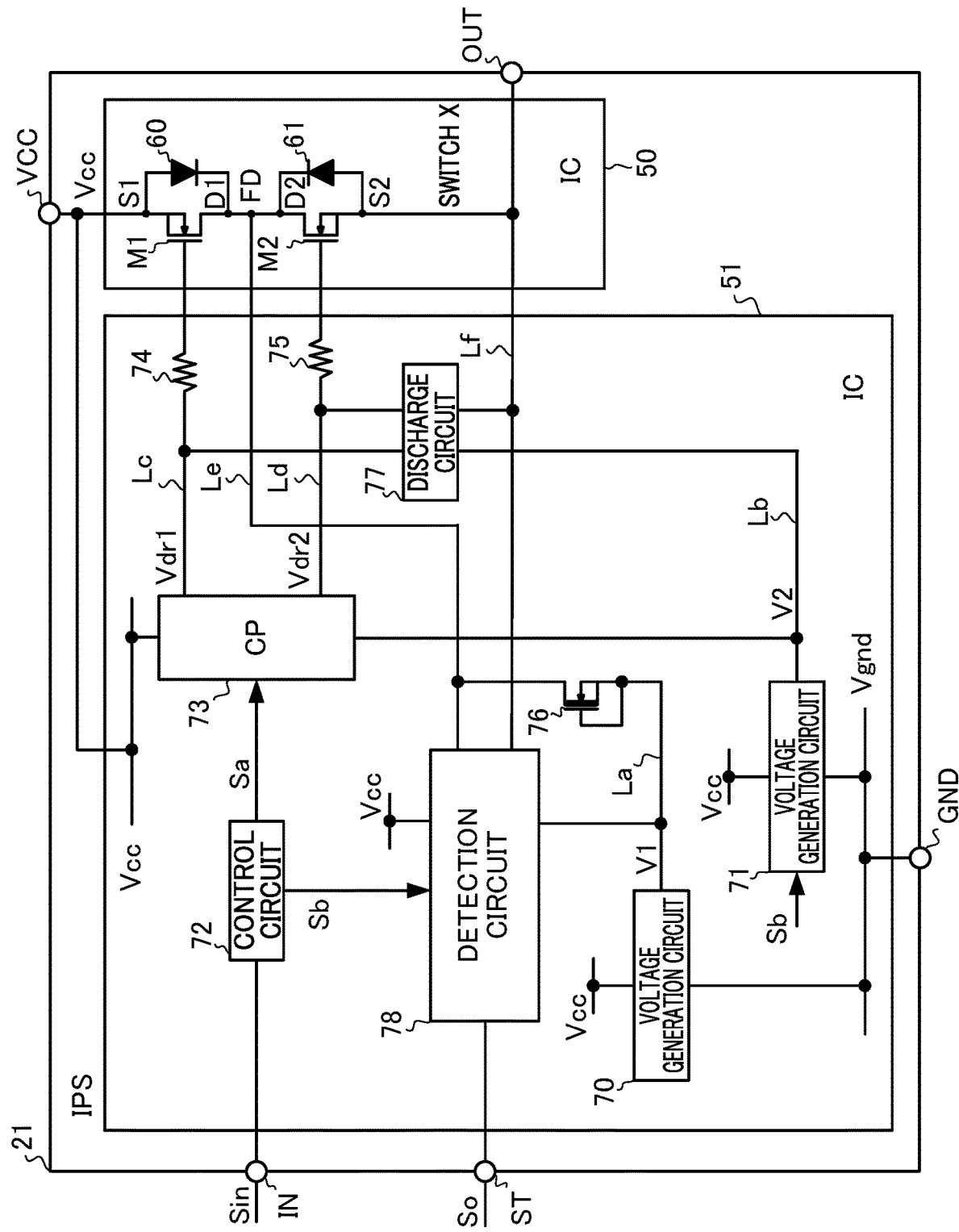
FIG. 2 is a diagram illustrating an example of an intelligent power switch (IPS) 21.

FIG. 2 is a diagram illustrating an example of a configuration of the IPS 21. The IPS 21 comprises: an integrated circuit (IC) 50 in which a switch (described later) is formed; and an IC 51 including a circuit to turn on and off the switch.

===IC 50===

The IC 50 includes two metal-oxide-semiconductor (MOS) transistors configuring the switch (hereinafter referred to as "switch X") for switching between outputting and not outputting the power supply voltage Vcc from the terminal OUT. Particularly, in an embodiment of the present disclosure, the two transistors are n-type metal-oxide-semiconductor (NMOS) transistors M1, M2.

The NMOS transistor M1 has its source electrode S1 coupled to the terminal VCC to which the power supply voltage Vcc is applied. A diode 60 is formed as a body diode between the source electrode S1 and a drain electrode D1 of the NMOS transistor M1.

The NMOS transistor M2 has its source electrode S2 coupled to the terminal OUT and its drain electrode D2 coupled to the drain electrode D1 of the NMOS transistor M1. A diode 61 is formed, as a body diode, between the source electrode S2 and the drain electrode D2 of the NMOS transistor M2.

Here, the drain electrodes D1, D2 of the NMOS transistors M1, M2 are coupled in series. Thus, upon turning on of both of the NMOS transistors M1, M2, the power supply voltage Vcc at the terminal VCC is outputted from the terminal OUT, thereby driving the coil 12. When the NMOS transistors M1, M2 are both off, the current supply to the coil 12 coupled to the terminal OUT is stopped, and thus the driving of the coil 12 is also stopped.

The diode 60 has an anode coupled to the terminal VCC, and a cathode coupled to the cathode of the diode 61. The anode of the diode 61 is coupled to the terminal OUT. Thus, the diodes 60, 61 provided between the terminal VCC and the terminal OUT are coupled to each other with their cathodes facing each other.

Accordingly, when the NMOS transistors M1, M2 are both off, for example, the power supply voltage Vcc applied to the terminal VCC is interrupted by the diode 61. Meanwhile, for example, in a case where the battery 11 is reversely coupled and the power supply voltage Vcc is applied to the terminal OUT, the power supply voltage Vcc at the terminal OUT is interrupted by the diode 60.

The "reversely coupling" herein refers to a state in which the positive electrode of the battery 11 is coupled to the ground-side terminal (e.g., the terminal GND), and the negative electrode of the battery 11 is coupled to the power-supply-side terminal (e.g., the terminal VCC). Thus, the IPS 21 can appropriately protect the coil 12 and the ECU 13 when the battery 11 is reversely coupled.

Note that, in an embodiment of the present disclosure, the NMOS transistor M1 corresponds to a "first MOS transistor," and the NMOS transistor M2 corresponds to a "second MOS transistor." Further, the terminal VCC corresponds to a "first terminal," and the terminal OUT corresponds to the "second terminal."

===IC 51===

The IC 51 in FIG. 2 is a circuit that turns on and off the "switch X" in response to the signal Sin, and comprises voltage generation circuits 70, 71, a control circuit 72, a charge pump circuit 73, resistors 74, 75, an NMOS transistor 76, and a discharge circuit 77.

<<Voltage Generation Circuit 70>>

Figure 3:
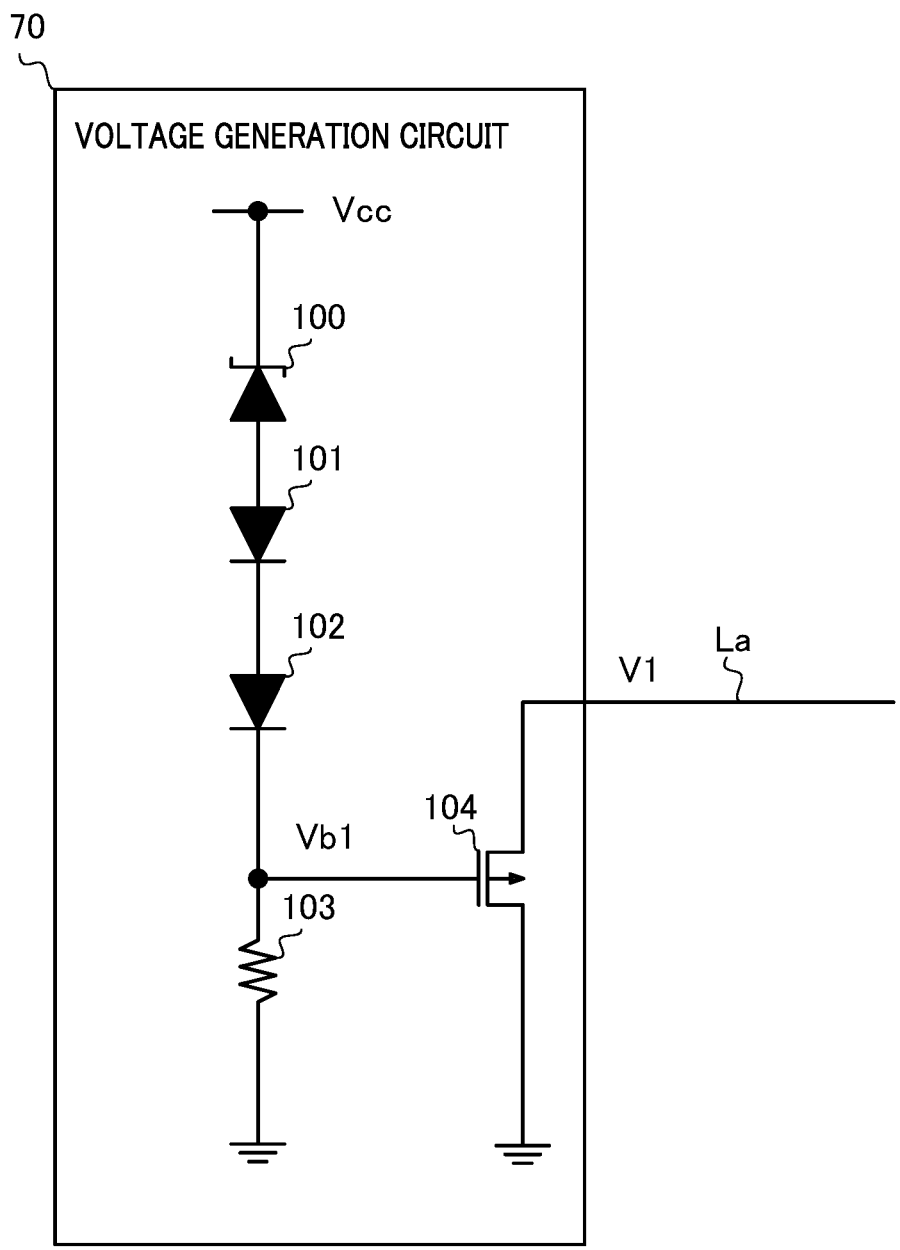
FIG. 3 is a diagram illustrating an example of a voltage generation circuit 70.

The voltage generation circuit 70 generates, based on the power supply voltage Vcc from the battery 11, a voltage V1 to be used as a reference by a predetermined logic circuit (not illustrated) in a detection circuit 78, for example, and applies the voltage V1 to a line La. FIG. 3 is a diagram illustrating an example of the voltage generation circuit 70. The voltage generation circuit 70 comprises a zener diode 100, diodes 101, 102, a resistor 103, and a PMOS transistor 104. Note that the voltage generation circuit 70 corresponds to a "first voltage generation circuit," and the voltage V1 corresponds to a "first voltage."

The zener diode 100, the diodes 101, 102, and the resistor 103 are elements that are coupled in series. Thus, a voltage Vb1 is generated at the node at which the diode 102 and the resistor 103 are coupled to each other, the voltage Vb1 being lower than the power supply voltage Vcc by a breakdown voltage Vz of the zener diode 100 and the forward voltages Vf of the diodes 101, 102.

Here, assuming, for example, that the breakdown voltage Vz of the zener diode 100 is 5.6 V and the forward voltages Vf of the diodes 101, 102 are 0.7 V, the voltage Vb1 results in, for example, Vcc—7 V (=5.6 V+1.4 V).

Since the drain electrode of the PMOS transistor 104 is grounded, the PMOS transistor 104 operates as a source follower that outputs, from its source electrode, the voltage V1 which corresponds to the voltage Vb1 applied to its gate electrode. In an embodiment of the present disclosure, the threshold voltage of the PMOS transistor 104 is, for example, 1.5 V, and thus the voltage V1 results in a voltage (Vcc—5.5 V) using the power supply voltage Vcc as a reference.

Further, using this voltage V1 as a reference, the predetermined logic circuit (not illustrated) included in the detection circuit 78 (described later) in FIG. 2 operates. Thus, for example, even if the level of the power supply voltage Vcc supplied to the detection circuit 78 rises, the predetermined logic circuit can operate based on the voltage of 5.5 V using the voltage V1 as a reference.

Note that, in an embodiment of the present disclosure, the term "line" refers to wiring that is made of, for example, aluminum or copper, is formed in a semiconductor chip, and electrically couples predetermined two nodes. Also, as long as the "line" electrically couples predetermined two nodes, an element such as a resistor and/or the like may be provided at some midpoint on the "line".

<<Voltage Generation Circuit 71>>

Based on the power supply voltage Vcc and a signal Sb (described later), the voltage generation circuit 71 generates a voltage V2 to be used as a reference by, for example, the charge pump circuit 73 and the discharge circuit 77, and applies the voltage V2 to a line Lb. Specifically, the voltage generation circuit 71 lowers the voltage V2 when the charge pump circuit 73 turns on the switch X, and raises the voltage V2 when the charge pump circuit 73 turns off the switch X.

Although details will be described later, this enables the charge pump circuit 73 to turn on the switch X in a shorter period of time.

Figure 4:
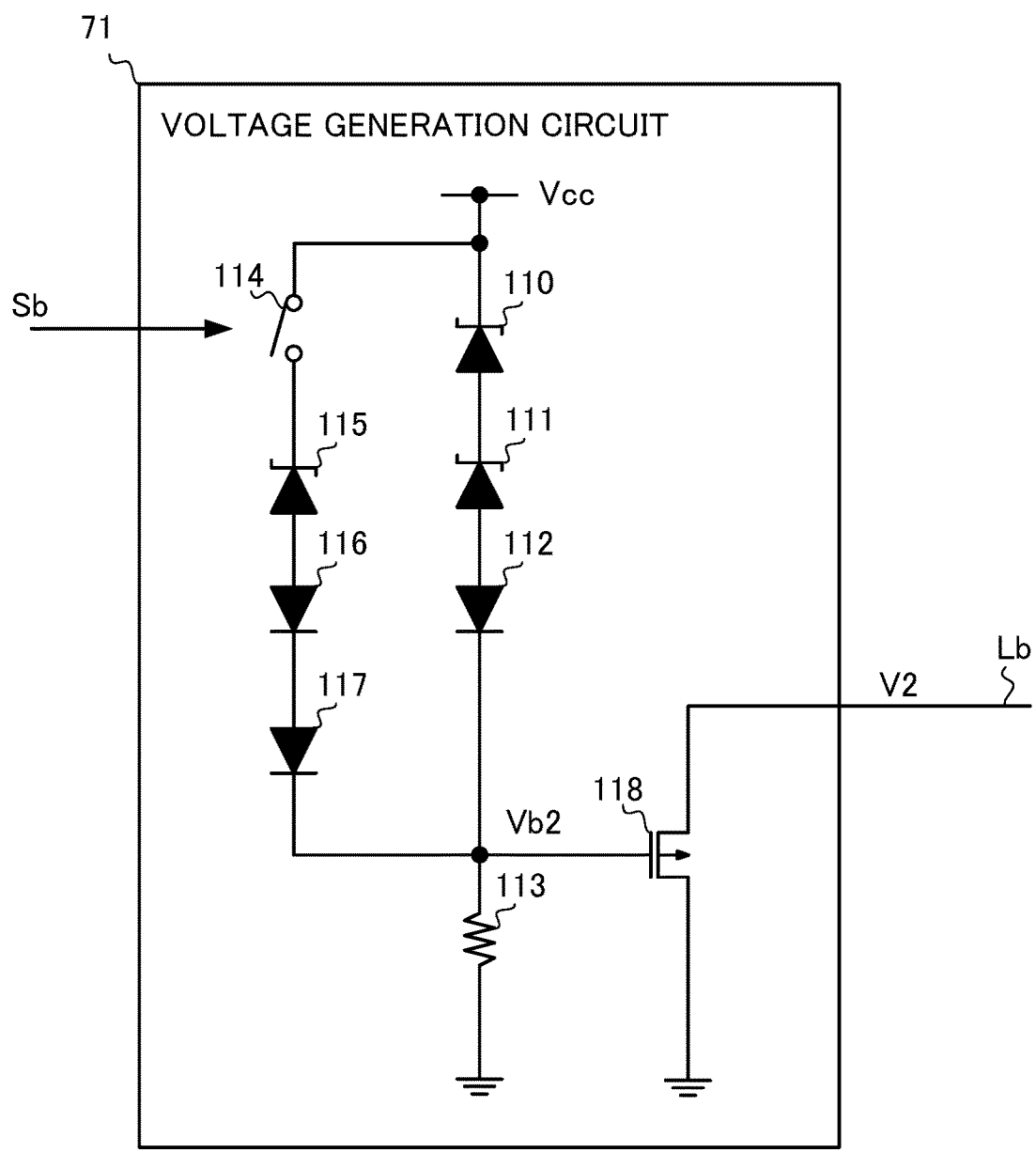
FIG. 4 is a diagram illustrating an example of a voltage generation circuit 71.

FIG. 4 is a diagram illustrating an example of the voltage generation circuit 71. The voltage generation circuit 71 comprises zener diodes 110, 111, 115, diodes 112, 116, 117, a resistor 113, a switch 114, and a PMOS transistor 118. Note that the voltage generation circuit 71 corresponds to a "second voltage generation circuit," and the voltage V2 corresponds to a "second voltage."

The zener diodes 110, 111, the diode 112, and the resistor 113 are elements that are coupled in series. Thus, when the switch 114 (described later) is off, a voltage Vb2 is generated at the node at which the diode 112 and the resistor 113 are coupled to each other, the voltage Vb2 being lower than the power supply voltage Vcc by a breakdown voltage Vx of the zener diodes 110, 111 and the forward voltage Vf of the diode 112. Here, assuming, for example, that the breakdown voltage Vz of the zener diodes 110, 111 is 5.6 V and the forward voltage Vf of the diode 112 is 0.7 V, the voltage Vb2 results in substantially Vcc—12 V (≈11.2 V+0.7 V).

The zener diode 115 and the diodes 116, 117 are similar to the zener diode 100 and the diodes 101, 102 of the voltage generation circuit 70, respectively, and are provided between the switch 114 and the resistor 113. Accordingly, the voltage generated at the zener diode 115 and the diodes 116, 117 results in 7 V. Hence, when the switch 114 is on, the voltage Vb2 is, for example, Vcc—7 V.

The switch 114 is turned off upon the signal Sb inputted thereto becoming high level (hereinafter referred to as high or high level), and is turned on upon the signal Sb becoming low level (hereinafter referred to as low or low level). Accordingly, the voltage V2 from the PMOS transistor 118 operating as a source follower is Vcc—10.5 V when the signal Sb is high, and is Vcc—5.5 V when the signal Sb is low. It is assumed here that the threshold voltage of the PMOS transistor 118 is 1.5 V.

<<Control Circuit 72>>

The control circuit 72 is a logic circuit that generates a signal Sa for turning on and off the "switch X" and a signal Sb that changes similarly to the signal Sa, in response to the signal Sin for giving instruction to turn on and off the "switch X". The signals Sa, Sb go high when the "switch X" is to be turned on, and go low the "switch X" is to be turned off.

<<Charge Pump Circuit 73>>

The charge pump circuit 73 generates predetermined voltages Vdr1, Vdr2 for respectively turning on the NMOS transistors M1, M2 configuring the "switch X," in response to the high signal Sa. Specifically, upon receiving the high signal Sa, the charge pump circuit 73 applies the voltage Vdr1 for turning on the NMOS transistor M1 to a line Lc, and applies the voltage Vdr2 for turning on the NMOS transistor M2 to a line Ld. Upon receiving the low signal Sa, the charge pump circuit 73 stops generating the voltages Vdr1, Vdr2.

The line Lc is wiring to couple the gate electrode of the NMOS transistor M1 and an output of the charge pump circuit 73 through a resistor 74. The line Ld is wiring to couple the gate electrode of the NMOS transistor M2 and an output of the charge pump circuit 73 through a resistor 75. The resistors 74, 75 are so-called gate resistors for preventing the NMOS transistors M1, M2 from being turned on suddenly. Although details will be described later, elements such as a resistor and/or the like other than the resistor 75 are also coupled to the line Ld in an embodiment of the present disclosure. Also, although only one resistor 74 is provided on the line Lc, for example, two or more resistors may be provided.

The charge pump circuit 73 is supplied with the power supply voltage Vcc using the voltage V2 as a reference. Then, as described above, the voltage V2 is, for example, Vcc—10.5 V the "switch X" is turned on, and is, for example, Vcc—5.5 V the "switch X" is turned off. In other words, the charge pump circuit 73 can generate the voltages Vdr1, Vdr2 based on 10.5 V greater than 5.5 V in turning on the "switch X". Accordingly, the charge pump circuit 73 can raise the voltages Vdr1, Vdr2 and turn on the "switch X" in a shorter period of time.

<<NMOS Transistor 76>>

The NMOS transistor 76 is a depletion-type transistor, and its drain electrode is coupled to a line Le. Here, the line Le refers to wiring that couples the detection circuit 78 and a "node FD" at which the drain electrodes of the NMOS transistors M1, M2 are coupled to each other. The gate electrode and the source electrode of the NMOS transistor 76 are coupled to the line La. Thus, the NMOS transistor 76 is always on, thereby passing a predetermined current (e.g., a small current of several microamperes).

Since the NMOS transistor 76 is always on, the NMOS transistor 76 operates as a device to couple the line Le and the line La to prevent the line Le from being brought into a floating state when the current supply to the node FD, for example, from the power supply terminal VCC stops. Specifically, the NMOS transistor 76 operates as a pull-up device that pulls up the line Le to the line La to which the voltage V1 is applied. Note that the NMOS transistor 76 corresponds to a "first device (third MOS transistor)," the line Le corresponds to a "first line," and the line La corresponds to a "second line."

<<Discharge Circuit 77>>

The discharge circuit 77 is a circuit to turn off the NMOS transistors M1, M2 configuring the "switch X." Specifically, the discharge circuit 77 discharges the gate capacitance of the NMOS transistor M1 to the coil 12 through the lines Lc, Lf and the terminal OUT. Further, the discharge circuit 77 discharges the gate capacitance of the NMOS transistor M2 through two paths: a "path A" passing through the lines Ld, Lb and a "path B" passing through the lines Ld, Lf. Specifically, the "path A" refers to a path through which a current flows toward the terminal GND through the lines Ld, Lb and the voltage generation circuit 71, and the "path B" refers to a path through which a current flows toward the grounded coil 12 through the lines Ld, Lf and the terminal OUT.

Figure 5:
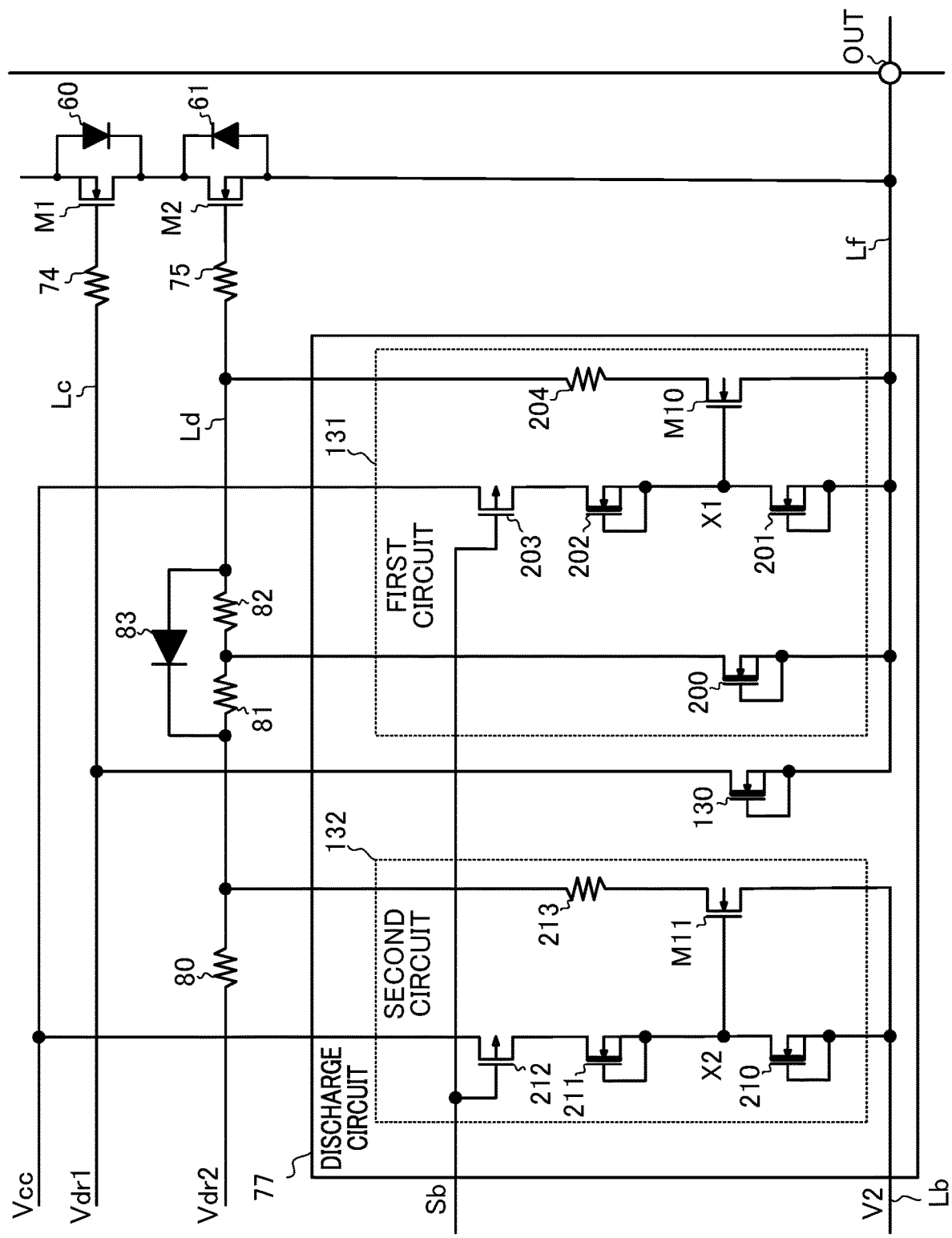
FIG. 5 is a diagram illustrating an example of a discharge circuit 77.

FIG. 5 is a diagram illustrating an example of a configuration of the discharge circuit 77. The discharge circuit 77 comprises an NMOS transistor 130, a first circuit 131, and a second circuit 132.

==NMOS Transistor 130==

The NMOS transistor 130 is a depletion-type transistor that discharges the gate capacitance of the power-supply-side NMOS transistor M1 to the terminal OUT. The drain electrode of the NMOS transistor 130 is coupled to the line Lc extending from the gate electrode of the NMOS transistor M1. The gate and source electrodes of the NMOS transistor 130 are coupled to the line Lf extending from the terminal OUT. Thus, the NMOS transistor 130 is always on, thereby discharging the gate capacitance of the NMOS transistor M1 to the line Lf with a very small predetermined current (e.g., several microamperes). Note that the line Lf corresponds to a "third line," the line Lc corresponds to a "sixth line," and the NMOS transistor 130 corresponds to a "discharge device (fifth MOS transistor)."

As described above, the current flowing through the NMOS transistor 130 is very small. Accordingly, the influence of the NMOS transistor 130 is negligible, when the charge pump circuit 73 applies the voltage Vdr1 to the line Lc to turn on the NMOS transistor M1.

Although details will be described later, the discharge circuit 77 according to an embodiment of the present disclosure is designed to reliably turn off the ground-side NMOS transistor M2 of the "switch X". Thus, when the "switch X" is to be turned off, the discharge circuit 77 can turn off the switch X even if the power-supply-side NMOS transistor M1 is not turned off.

==First Circuit 131==

The first circuit 131 discharges the gate capacitance of the ground-side NMOS transistor M2 through the terminal OUT, upon the signal Sb going low to turn off the "switch X." Also, although details will be described later, for example, when the coil 12 coupled to the terminal OUT is decoupled therefrom, the first circuit 131 couples the line Lf and the line Ld to prevent the line Lf from being brought into a floating state. However, a time when the terminal OUT and the line Lf is brought in a floating state is in an abnormal condition, and thus a normal condition in which the coil 12 is coupled to the terminal OUT will be described first.

Although elements other than the resistor 75 provided on the line Ld are omitted in FIG. 2, resistors 80 to 82 and a diode 83 are further provided on the line Ld. Note that the resistors 80 to 82 are gate resistors similar to the resistor 75, and the diode 83 is an element that discharges the gate capacitance of the NMOS transistor M2. Further, for example, the line Le is omitted in FIG. 5, for convenience.

The first circuit 131 comprises NMOS transistors 200 to 202 and M10, a PMOS transistor 203, and a resistor 204.

The NMOS transistor 200 is a depletion-type transistor that discharges the gate capacitance of the NMOS transistor M2. The NMOS transistor 200 is similar to the NMOS transistor 130 and thus is not described here in detail. Note that the NMOS transistor 200 corresponds to a "fourth MOS transistor."

The NMOS transistors 201, 202 are both a depletion-type transistor whose gate electrode is coupled to its source electrode, and thus are always on. The NMOS transistors 201, 202 and the PMOS transistor 203 are coupled in series.

Thus, upon the signal Sb going low to turn off the "switch X," a voltage corresponding to, for example, the size ratio between the NMOS transistors 201 and 202 is generated at a node X1 at which the NMOS transistor 201 and the NMOS transistor 202 are coupled. Note that, in an embodiment of the present disclosure, the size ratio between the NMOS transistors 201 and 202 is determined such that a voltage at the node X1 is higher than the threshold voltage of the NMOS transistor M10 when the PMOS transistor 203 is on.

On the other hand, upon the signal Sb going high to turn on the "switch X," the PMOS transistor 203 is turned off. As a result, the node X1 is pulled down to the terminal OUT through the NMOS transistor 201, and thus the NMOS transistor M10 is turned off.

In this way, the NMOS transistors 201, 202 are devices that generate a voltage to turn on the NMOS transistor M10. Hence, the NMOS transistors 201, 202 may be replaced with resistors, respectively.

The NMOS transistor M10 is turned off when the "switch X" is to be turned on, and is turned on when the "switch X" is to be turned off. Then, when the NMOS transistor M10 is turned on, the gate capacitance of the NMOS transistor M2 is discharged to the coil 12 through the line Ld, the resistor 204, the NMOS transistor M10, the line Lf, and the terminal OUT. Note that the NMOS transistor M10 corresponds to a "first switch."

==Second Circuit 132==

The second circuit 132 discharges the gate capacitance of the NMOS transistor M2 through the line Lb upon the signal Sb going low to turn off the "switch X." Further, although details will be described later, for example, when the coil 12 coupled to the terminal OUT is decoupled therefrom, the second circuit 132 couples the line Ld and the line Lb to which the voltage V2 is applied, to prevent the line Lf coupled to the terminal OUT from being brought into a floating state.

The second circuit 132 comprises NMOS transistors 210, 211, M11, a PMOS transistor 212, and a resistor 213. The NMOS transistors 210, 211 and the PMOS transistor 212 of the second circuit 132 correspond to the NMOS transistors 201, 202 and the PMOS transistor 203 of the first circuit 131, respectively. Further, the NMOS transistor M11 and the resistor 213 of the second circuit 132 correspond to the NMOS transistor M10 and the resistor 204 of the first circuit 131, respectively.

Accordingly, the second circuit 132 operates similarly to the first circuit 131, except for the NMOS transistor 200. Note that the line Ld corresponds to the "fourth line," and the line Lb corresponds to a "fifth line." Further, the NMOS transistor M11 corresponds to a "second switch."

<<Detection Circuit 78>>

The detection circuit 78 in FIG. 2 detects whether there is an abnormality in the switch X and/or the like, based on the signal Sb, the voltage of the line Le, and the voltage of the line Lf. FIG. 6 is a diagram illustrating the relationship between the various states of the IPS 21 and the signal So outputted from the detection circuit 78. Here, a "state 1 (normal)" indicates a state in which the IPS 21 is in a normal condition, and a "state 2" to a "state 7" indicate states in which there is an abnormality in a circuit and/or the like in the IPS 21.

Specifically, the "state 2 (M1 not turned on)" indicates a state in which the power-supply-side NMOS transistor M1 of the "switch X" is not turned on, and the "state 3 (power supply open-circuited)" indicates a state in which, for example, the wiring from the terminal VCC to the source electrode of the NMOS transistor M1 in FIG. 2 is broken. The "state 4 (M1 short-circuited)" indicates a state in which the NMOS transistor M1 is short-circuited, in other words, has a short-circuit failure.

The "state 5 (M2 not turned on)" indicates a state in which the ground-side NMOS transistor M2 of the "switch X" is not turned on, and the "state 6 (output open-circuited)" indicates a state in which, for example, the wiring coupling the terminal OUT and the coil 12 is broken or decoupled therefrom. The "state 7 (M2 short-circuited)" indicates a state in which the NMOS transistor M2 has a short-circuit failure.

Although details will be described later, in an embodiment of the present disclosure, the voltage levels of the lines Le, Lf in the IC 51 change according to the logic level of the signal Sb and the states 1 to 7. Thus, it is possible to determine the state of the IPS 21 by referring to the voltage levels of the lines Le, Lf and the logic level of the signal Sb. The following describes the states 1 to 7 in each of the cases where the "switch X" is off and on.

<<<"Switch X" is Off>>>

First, a description will be given of voltages of the lines Le, Lf in the states 1 to 7 when the "switch X" is off.

==State 1 (Normal)==

In the state 1 in which the IPS 21 is in a normal condition, when the "switch X" is off, in other words, the NMOS transistors M1, M2 in FIG. 2 are off, the power supply voltage Vcc from the terminal VCC is applied to the node FD through the diode 60. Thus, assuming that the power supply voltage Vcc is high "H" and the forward voltage Vf of the diode 60 is "0.7 V", the voltage of the line Le is "H—0.7 V."

Meanwhile, the power supply voltage Vcc is not passed to the terminal OUT because the NMOS transistor M2 and the diode 61 are both off. Further, as illustrated in FIG. 1, the coil 12 has one end grounded and the other end coupled to the terminal OUT, and thus the terminal OUT is grounded as well. Accordingly, the voltage of the line Lf coupled to the terminal OUT is 0 V (ground voltage), in other words, low.

==State 2 (M1 not Turned on)==

The state 2 indicates a state in which the NMOS transistor M1 is not turned on even if the charge pump circuit 73 operates to drive the NMOS transistor M1. Since the state 2 indicates an abnormality that occurs when the "switch X" is to be turned on, details will be described later. Further, when the "switch X" is off, the state 2 is substantially similar to the state 1. Thus, the line Le is "H—0.7 V," and the line Lf is low.

==State 3 (Power Supply Open-Circuited)==

Figure 7:
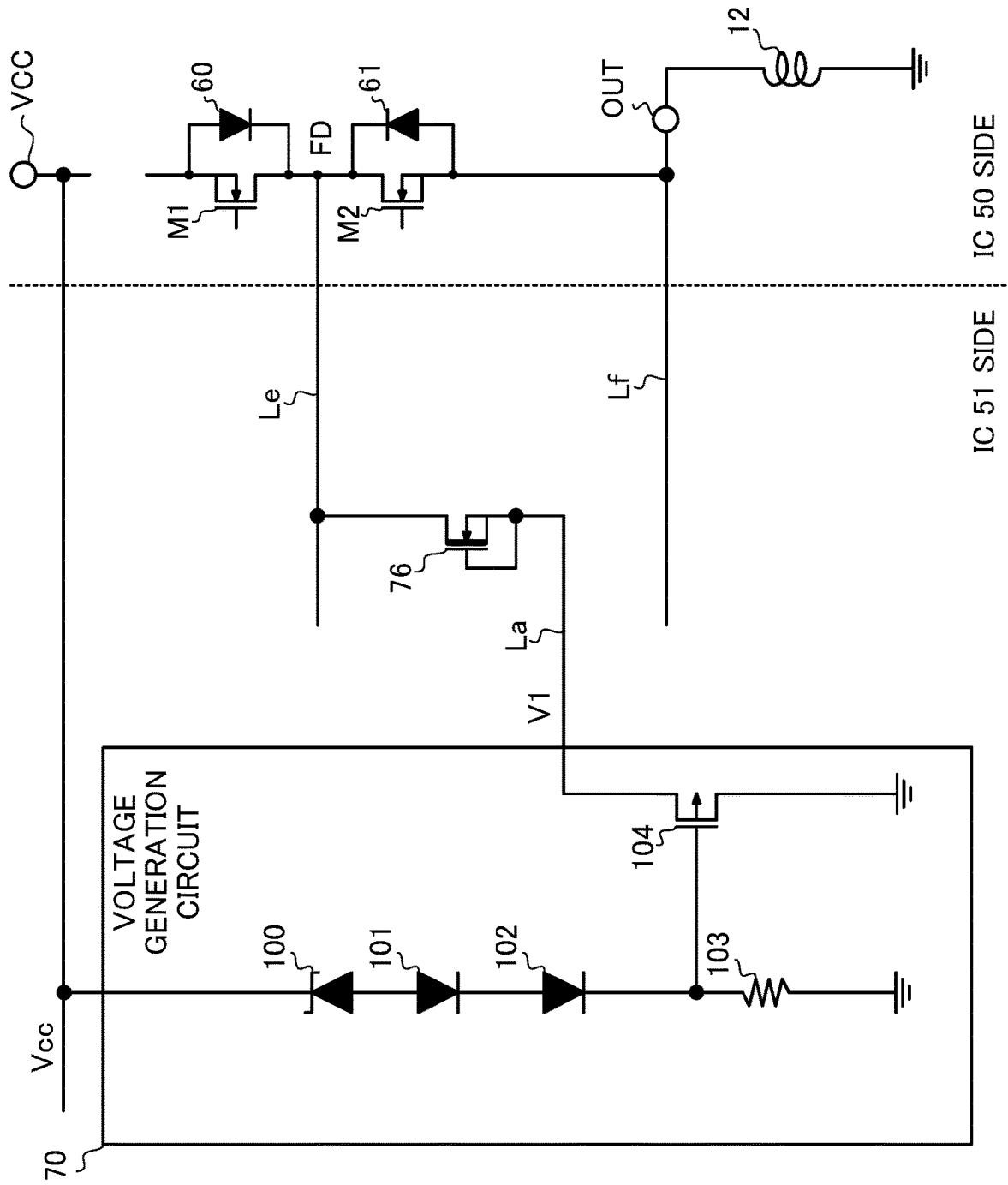
FIG. 7 is a diagram illustrating a state in which supply of a power supply voltage Vcc to an NMOS transistor M1 is stopped.

FIG. 7 is a diagram illustrating a state in which the wiring from the terminal VCC to the source electrode of the NMOS transistor M1 is broken. In such a state, the power supply voltage Vcc is not applied to the node FD. Thus, if there were no NMOS transistor 76, the node FD would be brought into a floating state.

However, the line Le coupled to the node FD is coupled to the NMOS transistor 76, which is always on. Thus, the line Le is coupled, through the NMOS transistor 76, to the line La to which the voltage V1 is applied. Accordingly, the voltage level of the line Le is "H—5.5 V", as illustrated in FIG. 6. Meanwhile, the line Lf coupled to the terminal OUT is grounded through the coil 12. Accordingly, the voltage level of the line Lf is low.

==State 4 (M1 Short-Circuited)==

For example, if the NMOS transistor M1 is short-circuited in FIG. 2, a voltage at the node FD results in the power supply voltage Vcc. As a result, the voltage of the line Le is high. Meanwhile, the line Lf coupled to the terminal OUT is grounded through the coil 12. Accordingly, the voltage level of the line Lf goes low.

==State 5 (M2 not Turned on)==

The state 5 indicates a state in which the NMOS transistor M2 is not turned on even if the charge pump circuit 73 operates to drive the NMOS transistor M2. Since the state 5 indicates an abnormality that occurs when the "switch X" has been turned on, details will be described later. Further, when the "switch X" is off, the state 5 is substantially the same as the state 1. Thus, the line Le is "H—0.7 V," and the line Lf is low.

==State 6 (Output Open-Circuited)==

When the "switch X" is off, for example, the power supply voltage Vcc is applied to the source electrode of the NMOS transistor M1, even if the wiring between the terminal OUT and the coil 12 is broken or decoupled therefrom. Thus, the voltage at the node FD, in other words, the voltage of the line Le, is "Vcc—0.7 V."

Figure 8:
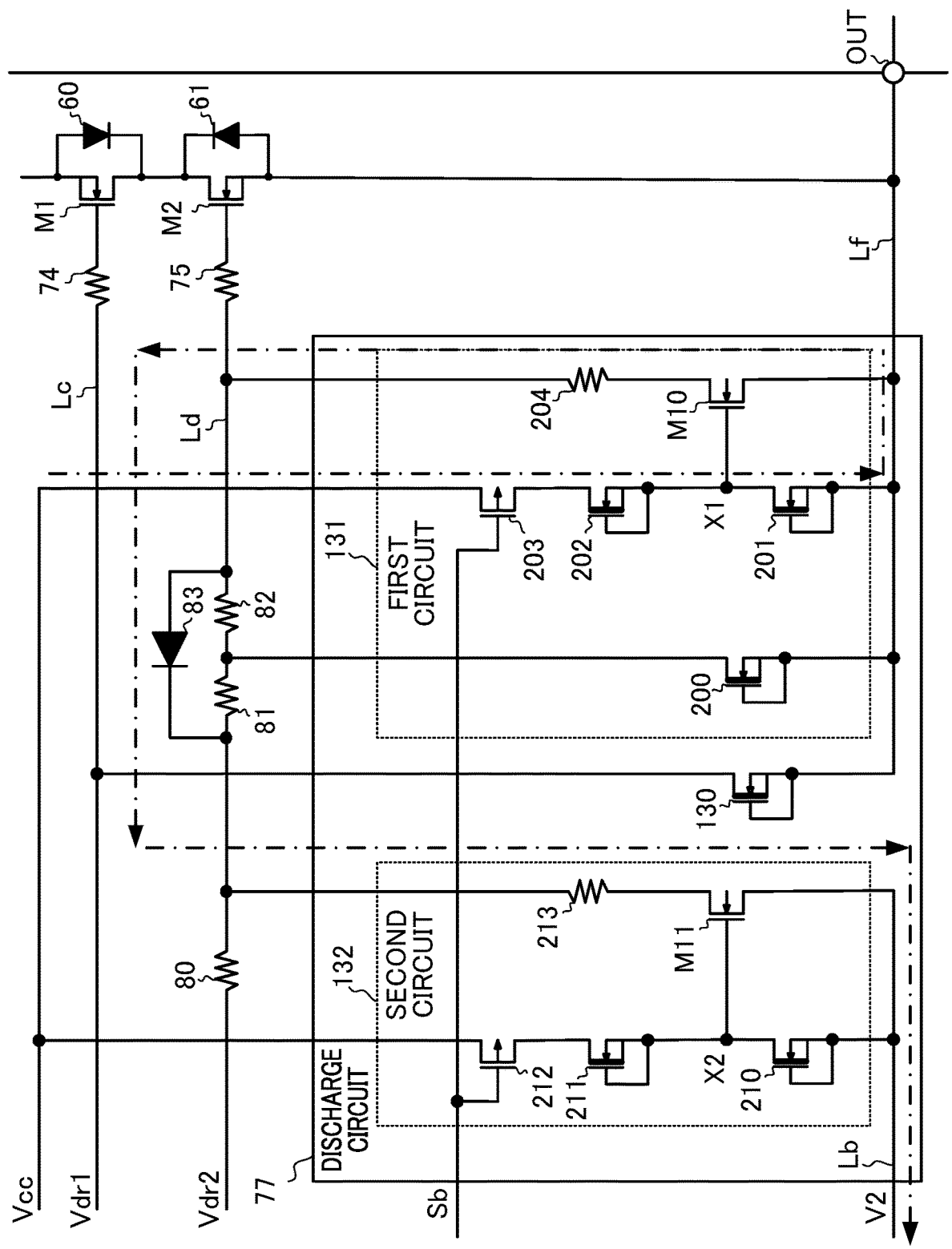
FIG. 8 is a diagram illustrating a state in which a coil 12 is decoupled from a terminal OUT.

FIG. 8 is a diagram illustrating a state in which the wiring between the terminal OUT and the coil 12 is broken or decoupled therefrom. Since the "switch X" is off here, the power supply voltage Vcc is not applied to the terminal OUT. Thus, if there were no first circuit 131 and/or the like, the line Lf would be brought into a floating state. However, since the power supply voltage Vcc is supplied to the discharge circuit 77, a current flows from the power supply voltage Vcc toward the line Lf, as given by the dotted and dashed line.

First, when a current flows through the PMOS transistor 203 and the NMOS transistors 201, 202, the voltage at the node X1 rises, thereby turning on the NMOS transistor M10. As a result, the line Lf and the line Ld are coupled through the NMOS transistor M10 and the resistor 204. Then, the current from the power supply voltage Vcc flows from the line Lf to the line Ld through the NMOS transistor M10 and the resistor 204.

Similarly to the NMOS transistor M10, the NMOS transistor M11 of the second circuit 132 is also on. Thus, the line Ld and the line Lb are electrically coupled, so that a current flows from the line Ld to the Line Lb through the resistor 213 and the NMOS transistor M11. Note that a current flowing to the line Lb is outputted to the ground through the PMOS transistor 118, illustrated in FIG. 4, which operates as a source follower.

As such, in an embodiment of the present disclosure, when there is an open circuit the terminal OUT and the ground, the line Lf from the terminal OUT is coupled to the line Ld through the NMOS transistor M10 and the resistor 204. Further, the line Ld is coupled to the line Lb through the NMOS transistor M11 and the resistor 213. As a result, the line Lf is pulled up to the line Lb to which the voltage V2 ("H—5.5 V") is applied.

==State 7 (M2 Short-Circuited)==

For example, if the NMOS transistor M2 is short-circuited in FIG. 2, a voltage at the terminal OUT results in the voltage at the node FD. And, when the "switch X" is off, the voltage at the node FD results in "Vcc—0.7 V." Accordingly, both the voltage of the line Le coupled to the node FD and the voltage of the line Lf coupled to the terminal OUT results in "Vcc—0.7 V."

<<<"Switch X" is On>>>

Next, a description will be given of voltages of the lines Le, Lf in the states 1 to 7 when the "switch X" is on.

==State 1 (Normal)==

In the "state 1" in which the IPS 21 is in a normal condition, when the "switch X" is on, in other words, when the NMOS transistors M1, M2 in FIG. 2 are on, the power supply voltage Vcc from the terminal VCC is applied to the node FD and the terminal OUT. Thus, the voltages of the lines Le, Lf both result in being high.

==State 2 (M1 not Turned on)==

The state 2 indicates a state in which the NMOS transistor M1 is not turned on even if the charge pump circuit 73 operates to drive the NMOS transistor M1. Even in this case, the NMOS transistor M2 is on, and thus the power supply voltage Vcc from the terminal VCC is applied to the node FD and the terminal OUT through the diode 60. Thus, the voltages of the lines Le, Lf both result in "H—0.7 V."

==State 3 (Power Supply Open-Circuited)==

FIG. 7 is a diagram illustrating a state in which the wiring from the terminal VCC to the source electrode of the NMOS transistor M1 is broken. When the "switch X" is turned on in such a state, the node FD and the terminal OUT are pulled down to the ground through the coil 12. Accordingly, the voltages of the lines Le, Lf both result in being low.

==State 4 (M1 Short-Circuited)==

The state 4 indicates a state in which the NMOS transistor M1 of the "switch X" is short-circuited. Such a state is substantially the same as the "state 1," and thus the voltages of the lines Le, Lf both result in being high.

==State 5 (M2 not Turned on)==

The state 5 indicates a state in which the NMOS transistor M2 is not turned on even if the charge pump circuit 73 operates to drive the NMOS transistor M2. Even in such a case, the power supply voltage Vcc from the terminal VCC is applied to the node FD because the NMOS transistor M1 is on. Thus, the voltage of the line Le results in being high, and the voltage of the line Lf results in being low.

==State 6 (Output Open-Circuited)==

When the "switch X" is on, the power supply voltage Vcc is applied to the node FD and the terminal OUT, even if the wiring between the terminal OUT and the coil 12 is broken or decoupled therefrom. Thus, the voltages of the lines Le, Lf both result in being high.

==State 7 (M2 Short-Circuited)==

The state 7 indicates a state in which the NMOS transistor M2 of the "switch X" is short-circuited. Such a state is substantially the same as the state 1, and thus the voltages of the lines Le, Lf both result in being high.

<<<Output from Detection Circuit 78>>>

The detection circuit 78 outputs the signals So of the logic levels as illustrated in FIG. 6 based on the logic level of the signal Sb, the voltage level of the line Le, and the voltage level of the line Lf. Here, for example, when the "switch X" is off (when the signal Sb is low), the voltage level of the line Le may be one of three levels: "H—0.7 V," "H—5.5 V," and high level. Further, in an embodiment of the present disclosure, the voltage levels of the line Lf when the signal Sb is low, the line Le when the signal Sb is high, and the line Lf when the signal Sb is high each may also be one of the three levels.

Accordingly, for each of the two logic levels of the signal Sb, the detection circuit 78 first converts voltages, each being one of the three levels, inputted thereto from the respective lines Le, Lf into two-bit data, for example. Then, the detection circuit 78 logically synthesizes the converted data to output the signal So of either logic level as illustrated in FIG. 6. Note that the detection circuit 78 comprises, for example, a converter circuit (not illustrated) that converts inputted voltages each being one of the three levels into two-bit data, and a logic circuit (not illustrated) that logically synthesizes outputs from the converter circuit.

When the signal Sb is low, the detection circuit 78 as such outputs the high signal So upon the IPS 21 entering the state 1, 2, or 5, and outputs the low signal So upon the IPS 21 entering the state 3, 4, 6, or 7. Further, when the signal Sb is high, the detection circuit 78 outputs the low signal So upon the IPS 21 entering the state 1, 4, 6, or 7, and outputs the high signal So upon the IPS 21 entering the state 2, 3, or 5. Note that, in an embodiment of the present disclosure, when the signal Sb is low, the low signal So indicates that there is an abnormality in the "switch X" and/or the like, and when the signal Sb is high, the high signal So indicates that there is an abnormality in the "switch X" and/or the like.

When detecting that there is an abnormality in the "switch X" and/or the like based on the logic level of the signal outputted from the IPS 21, the microcomputer 20 illustrated in FIG. 1, for example, outputs the signal Sin for turning off the "switch X", and turns off the switch 22. As a result, the motor control device 10 can, for example, safely drive the coil 12 of the motor. Note that an "abnormality in the "switch X" and/or the like" includes, for example, an abnormality in a path from the power-supply-side terminal VCC to the "switch X," an abnormality in the "switch X," and an abnormality at the terminal OUT.

==Summary==

The motor control device 10 according to an embodiment of the present disclosure has been described above. The detection circuit 78 can detect that at least the NMOS transistor M1 is short-circuited, upon the voltage of the line Le becoming high when the coil 12 is coupled to the terminal OUT and the "switch X" is off, for example (the state 4 under "OFF" in FIG. 6). In this way, in an embodiment of the present disclosure, it is possible to detect a failure in the NMOS transistor M1 based on the voltage level of the line Le, and thus it is unnecessary to have a complicated configuration, such as varying the voltage to be applied to the node FD, for example.

Further, the detection circuit 78 can detect that the NMOS transistor M1 is not turned on, upon the voltage of the line Le reaching "H—0.7 V," when the coil 12 is coupled to the terminal OUT and the "switch X" is on, for example (the state 2 under "ON" in FIG. 6).

Further, the detection circuit 78 can detect whether the power supply voltage Vcc is being supplied to the NMOS transistor M1 based on the voltage of the line Le, for example, when the coil 12 is coupled to the terminal OUT (the state 3 under "OFF" and the state 3 under "ON" in FIG. 6).

To prevent the line Le from being brought into a floating state, for example, a resistor may be coupled between the line Le and the line La. However, in such a case, unless the resistance value of the resistor is increased, the value of the current flowing from the line Le to the line La increases, which increases power consumption. In an embodiment of the present disclosure, the NMOS transistor 76 is used, thereby enabling reduction in area and power consumption.

Further, for example, if the NMOS transistor M2 of the "switch X" is short-circuited, the level of the line Lf results in "H—0.7 V" even through the "switch X" is off. In such a case, the detection circuit 78 can detect that the NMOS transistor M2 has a failure based on the voltage level of the line Lf (the state 7 under "OFF" in FIG. 6).

Further, for example, when the NMOS transistor M2 is not turned on even through the "switch X" has been turned on, the level of the line Lf results in being low. Accordingly, the detection circuit 78 can detect that the NMOS transistor M2 has a failure (the state 5 under "ON" in FIG. 6).

Further, for example, if the coil 12 is decoupled from the terminal OUT, the line Lf coupled to the terminal OUT is coupled, through the first circuit 131 and the second circuit 132, to the line Lb to which the voltage V2 is applied. As a result, the voltage V2 is applied to the line Lf, which makes it possible that the detection circuit 78 detects that the coil 12 is not coupled to the terminal OUT based on the voltage level of the line Lf (the state 6 under "OFF" in FIG. 6).

Further, to prevent the line Lf from being brought into a floating state, for example, only a resistor may be used in place of the NMOS transistor M10 and the resistor 204 of the first circuit 131. However, in such a case, the resistance value needs to be large to prevent a large current from flowing to the terminal OUT through the resistor when the NMOS transistor M2 is turned on. An embodiment of the present disclosure uses the NMOS transistor M10 that is turned on and off in a manner complementary to that of the "switch X", thereby being able to, for example, reduce the resistance value of the resistor 204 that limits a current.

Further, the first circuit 131 includes the NMOS transistor 200 to discharge the gate capacitance of the NMOS transistor M2 through the line Ld. Thus, the first circuit 131 can turn off the NMOS transistor M2 in a shorter period of time.

Further, to prevent the line Ld from being brought into a floating state, for example, only a resistor may be used in place of the NMOS transistor M11 and the resistor 213 in the second circuit 132. However, in such a case, the resistance value needs to be large to prevent a large current from flowing to the line Lb through the resistor when the NMOS transistor M2 is turned on. An embodiment of the present disclosure uses the NMOS transistor M11 that is turned on and off in a manner complementary to that of the "switch X", thereby being able to, for example, reduce the resistance value of the resistor 213 that limits a current.

Further, in an embodiment of the present disclosure, the NMOS transistor 130 that discharges the gate capacitance of the NMOS transistor M1 is provided, thereby being able to prevent the NMOS transistor M1 from being turned on erroneously when the charge pump circuit 73 stops operating.

The use of the NMOS transistor 130 instead of a resistor, as a device to discharge the gate resistance of the NMOS transistor M1 enables reduction in area and discharge current.

Further, when the charge pump circuit 73 turns on the "switch X," the voltage generation circuit 71 changes the level of the voltage V2 used as a reference by the charge pump circuit 73 from "Vcc—5.5 V" to "Vcc—10.5 V" which is lower. This makes it possible that the charge pump circuit 73 generates the voltages to turn on the NMOS transistors M1, M2 in a short period of time. Note that "Vcc—5.5 V" corresponds to a "first level," and "Vcc—10.5 V" corresponds to a "second level."

An embodiments of the present disclosure described above is simply to facilitate understanding of the present disclosure and is not in any way to be construed as limiting the present disclosure. The present disclosure may variously be changed or altered without departing from its essential features and encompass equivalents thereof.

For example, in an embodiment of the present disclosure, an output voltage from the IPS 21 is applied to the coil 12, which is a load, through the switch 22 in the ECU 13, however, the present disclosure is not limited to this. For example, the output voltage from the IPS 21 may be directly applied to the coil 12.

According to the present disclosure, it is possible to provide an integrated circuit capable of detecting a switch failure without a complicated configuration.

What is claimed is:

1. An integrated circuit for a semiconductor device that includes
   a first terminal for receiving a power supply voltage,
   a second terminal to which a load is to be coupled, and
   a first metal-oxide-semiconductor (MOS) transistor and a second MOS transistor, each having a drain electrode and a source electrode, the source electrodes of the first and second MOS transistors being respectively coupled to the first and second terminals,
the integrated circuit comprising:
   a first line coupled to the drain electrode of the first MOS transistor and the drain electrode of the second MOS transistor;
   a second line to which a first voltage lower than the power supply voltage is applied;
   a third line coupled to the second terminal;
   a first device configured to couple the first line and the second line, to prevent the first line from being brought into a floating state; and
   a detection circuit configured to detect a first abnormality in at least the first MOS transistor based on a voltage level of the first line, and to detect a second abnormality in at least the second MOS transistor based on a voltage level of the third line.

2. The integrated circuit according to claim 1, wherein the detection circuit is configured to detect the first abnormality in at least the first MOS transistor based on the voltage level of the first line, when both the first and second MOS transistors are off, or are on.

3. The integrated circuit according to claim 1, wherein the detection circuit detects whether the power supply voltage is being supplied to the first MOS transistor.

4. The integrated circuit according to claim 1, wherein the first device is a third MOS transistor, which is of a depletion type, and has a gate electrode and a source electrode coupled to each other.

5. The integrated circuit according to claim 1, further comprising:
   a fourth line coupled to the gate electrode of the second MOS transistor;
   a fifth line to which a second voltage lower than the power supply voltage is applied;
   a first circuit configured to couple the third line and the fourth line, to prevent the third line from being brought into the floating state; and
   a second circuit configured to couple the fourth line and the fifth line, to prevent the fourth line from being brought into the floating state.

6. The integrated circuit according to claim 5, wherein the detection circuit detects the second abnormality in at least the second MOS transistor based on the voltage level of the third line, when both the first and second MOS transistors are off, or are on.

7. The integrated circuit according to claim 5, wherein the detection circuit detects whether the load is coupled to the third line through the second terminal.

8. The integrated circuit according to claim 5, wherein the first circuit includes a first switch configured to be turned on and off in a first manner complementary to a second manner in which the first and second MOS transistors are turned on and off.

9. The integrated circuit according to claim 8, wherein the first circuit further includes a fourth MOS transistor, which is of a depletion type, and has a gate electrode and a source electrode coupled to each other.

10. The integrated circuit according to claim 8, wherein the second circuit includes a second switch configured to be turned on and off in a third manner complementary to the second manner in which the first and second MOS transistors are turned on and off.

11. The integrated circuit according to claim 5 further comprising:
   a sixth line coupled to the gate electrode of the first MOS transistor; and
   a discharge device configured to couple the sixth line and the third line.

12. The integrated circuit according to claim 11, wherein the discharge device is a fifth MOS transistor, which is of a depletion type, and has a gate electrode and a source electrode coupled to each other.

13. The integrated circuit according to claim 5, further comprising:
   a charge pump circuit configured to be supplied with the power supply voltage and to turn on the first and second MOS transistors using the second voltage as a reference;

a first voltage generation circuit configured to apply the first voltage to the second line; and a second voltage generation circuit configured to
- apply the second voltage of a first level to the fifth line, when the charge pump circuit is to turn off the first and second MOS transistors, and
- apply the second voltage of a second level lower than the first level to the fifth line, when the charge pump circuit is to turn on the first and second MOS transistors.

14. A semiconductor device, comprising:

a first terminal for receiving a power supply voltage;

a second terminal to which a load is to be coupled;

first and second metal-oxide-semiconductor (MOS) transistors each having a drain electrode, the drain electrodes being coupled to each other between the first terminal and the second terminal;

a first line coupled to the drain electrodes of the first and second MOS transistors;

a second line to which a first voltage lower than the power supply voltage is applied;

a third line coupled to the second terminal;

a first device configured to couple the first line and the second line, to prevent the first line from being brought into a floating state; and a detection circuit configured to detect whether there is an abnormality in at least the first MOS transistor based on a voltage level of the first line, when the first and second MOS transistors are off, and to detect a second abnormality in at least the second MOS transistor based on a voltage level of the third line.

* * * * *